United States Patent [19]

Brown et al.

[11] 4,162,369

[45] Jul. 24, 1979

[54] THERMOELECTRIC BATTERY, PROTECTED AGAINST SHOCKS AND ACCELERATIONS

[75] Inventors: Michael H. Brown, Newbury; John Myatt, Wantage, both of England

[73] Assignee: United Kingdom Atomic Energy Authority, England

[21] Appl. No.: 846,209

[22] Filed: Oct. 27, 1977

[51] Int. Cl.² ............................................. H01L 37/00
[52] U.S. Cl. .................................... 136/202; 136/230; 128/419 PS
[58] Field of Search .................. 128/419 PS; 136/202, 136/230

[56] References Cited

U.S. PATENT DOCUMENTS

| | | | |
|---|---|---|---|
| 3,857,738 | 12/1974 | Brown | 136/202 |
| 4,002,497 | 1/1977 | Brown | 136/202 |
| 4,026,726 | 5/1977 | Carney | 136/202 |

*Primary Examiner*—Leland A. Sebastian
*Attorney, Agent, or Firm*—Larson, Taylor and Hinds

[57] ABSTRACT

In a thermoelectric battery the heat source is suspended on the end of a thermoelectric unit, the other end of which is attached via a heat conducting mass to the casing. A resilient mounting permits resilient rocking of the thermoelectric unit to reduce stress on the unit in the event of shock or acceleration applied to the casing and spring fingers not normally in contact with the heat source or the thermoelectric unit are positioned to arrest the heat source if the assembly rocks more than a predetermined amount.

5 Claims, 3 Drawing Figures

THERMOELECTRIC BATTERY, PROTECTED AGAINST SHOCKS AND ACCELERATIONS

The invention relates to the protection against shocks or severe acceleration of miniature thermoelectric devices such as may be used for powering heart pacemakers.

The invention is a development of the device disclosed in the U.K. Pat. No. 1,351,630 which corresponds to U.S. Pat. No. 3,857,738.

The invention provides, in one of its aspects, a thermoelectric battery comprising a casing enclosing a thermoelectric assembly of elongated form, the assembly comprising a heat source, a heat sink and a thermoelectric unit attached to and extending between the heat source and the heat sink, with at least the heat source end of the assembly defining an annular space with the casing, a heat-conducting mass disposed at the heat sink end of the assembly and attached to the casing, a resilient mounting for the thermoelectric unit to reduce the stress applied thereto in the event of shock or acceleration applied to the battery, and spring fingers not normally in contact with the heat source or the thermoelectric unit but positioned to arrest the heat source in the event of rocking motion of the assembly in excess of a predetermined amount under the effects of shock or acceleration as aforesaid.

Severe accelerations may cause further movement of the body against the resilient support of the fingers causing one or more of the fingers to bend from their supported ends.

Preferably an abutment member is positioned to be engaged by a free end of a spring finger in the event that the spring finger is bowed to a predetermined extent by the force of the heat source acting upon the spring finger under the effect of severe shock or acceleration, further movement of the heat source in the direction of the said force being resisted by the resilience of the spring finger bending between two points of support.

The arrangement according to the invention as aforesaid is particularly appropriate for a thermoelectric battery in which the casing enclosing the assembly is evacuated for improving insulation against heat loss. With such an arrangement, it is not appropriate to use rubber within the casing to protect the device from the effects of shocks and acceleration forces.

The invention provides, in another of its aspects, a device comprising a body and a support member by which the body is attached to a base member, wherein there is provided a mechanism for restraining movement of the body relative to the base member to protect the support member from the effects of acceleration of the base member, which mechanism comprises additional support means not normally in contact with the body but movable into contact therewith, acceleration responsive means operative when acceleration of the base member exceeds a predetermined value to cause the additional support means to move into contact with the body to provide additional support for the body.

Preferably the arrangement is such that the additional support means returns to its normal position out of contact with the body when acceleration of the base member ceases.

Preferably the base member comprises a platform urged into contact with a support surface by a resilient biassing means, the contacting surfaces of the platform and the said support surface being shaped to permit rocking movement of the platform against the action of the biassing means, the said acceleration responsive means comprising means responsive to onset of rocking movement of the platform.

Preferably the said additional support means comprises a plurality of resilient fingers mounted to adopt a normal position out of contact with the body and the acceleration responsive means comprises a slider which is moved when the platform rocks, such movement of the slider causing relative movement between cam and cam follower surfaces associated with the resilient fingers for moving the resilient fingers into contact with the body. When the acceleration ceases, the resilient biassing means return the platform to its normal engagement with the support surface, and the slider and resilient fingers return to their normal positions.

Specific constructions of thermoelectric device embodying the invention will now be described by way of example and with reference to the accompanying drawings, in which.

Figure 1:
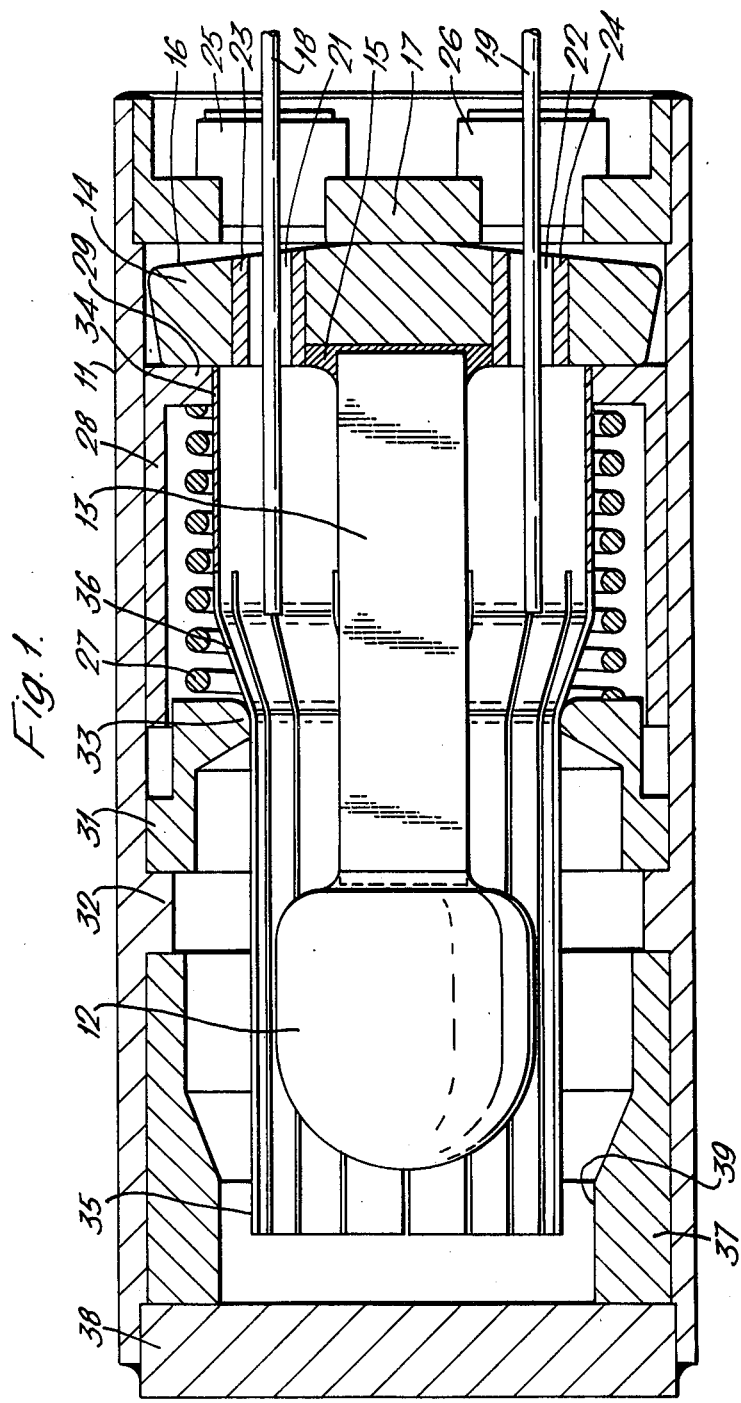
FIG. 1 is an axial section of a device.

In the example shown in FIG. 1 a cylindrical casing of stainless steel 11 encloses an assembly comprising a heat source 12 secured to one end of a thermoelectric unit which, in this example, comprises a thermoelectric module 13 in the form of a rectangular assembly of a plurality of thermoelectric elements secured together and electrically connected at their ends in the manner of a thermopile. The other end of the thermoelectric module 13 is secured with adhesive to a platform 14 of good thermal conductivity. In this example, the platform 14 is made of stainless steel and a layer 15 of epoxy resin is interposed between the thermoelectric module 13 and the platform 14 to provide electrical insulation whilst maintaining good heat conducting connection between the module and the platform. The platform 14 thus acts as a heat sink for the thermoelectric module 13 and provides a heat conducting path to the casing 11 via an insert 17, which the platform 14 contacts.

The surface of the platform 14 remote from the module 13 is of frusto-conical form and the flat central portion of this surface 16 abuts against the insert 17 which is welded into one end of the cylindrical casing 11. Electrical leads 18 and 19 for making electrical connection (not shown) to the thermoelectric module 13 pass through apertures 21, 22 in the platform 14. Each of the apertures is provided with an insulating sleeve 23, 24. An electrically insulating gas-tight seal is provided at 25 and 27 between each of the electrical leads 18 and 19 respectively and the insert 17.

The platform 14 is biassed into engagement with the insert 17 by the action of a spring 27 transmitted through a cylindrical sleeve 28 which is a sliding fit within the cylindrical casing 11. The sleeve 28 is of steel but preferably of a different composition from that of the casing 11 to avoid possible binding.

The cylindrical sleeve 28 has an end wall 29 which engages against the platform 14. The spring 27 acts between this end wall 29 and a buffer surface of an annular bridge member 31. The annular bridge member is located in the cylindrical casing 22 by a shoulder 32 and is shaped to provide a space between the cylindrical casing 11 and the bridge member 31 into which the end of the cylindrical sleeve 28 can slide against the action of the spring 27. The bridge member 31 also has an inwardly projecting annular portion 33 which provides a cam function described more fully below.

Mounted in the end wall 29 of the sleeve 28 is an annular collet 34 formed with twelve fingers 35 extending through the space between the heat source 12 and the cylindrical casing 11. In the drawing, for the sake of clarity, the slots between the fingers 35 are shown only partially. It will be appreciated that these slots all extend back as far as the cross hatching indicating the extent of the annular collet 34. The fingers 35 have two portions, a main portion extending parallel with the casing 11 between the casing 11 and the heat source 12 and a short inclined portion joining the main portion to the annular collet 34. This inclined portion 36 co-operates with the cam 33.

Received within the cylindrical casing 11 surrounding the heat source 12 is a sleeve 37. The sleeve is located between shoulder 32 and an end cap 38 welded to the casing 11 and serves two purposes. Firstly, the sleeve is made from a material which serves as a getter to assist in maintaining evacuation of the enclosure within the casing 11 and secondly, a radially inwardly protruding portion of the sleeve 37 provides a shoulder at 39, the function of which is described below.

It will be seen that the configuration of the components provides for easy assembly into the casing 11. The procedure is to bond the heat source 12 to the thermoelectric module 13 and the latter to the platform 14. The module leads (not shown) are then electrically connected to the leads 18 and 19 mounted in the insert 17. There is then inserted into the right hand end of the casing 11 (as seen in the drawing) in succession the bridge 31, the sleeve 28 together with the fingered collet 34 and spring 27 followed by the assembly of heat source 12, module 13, platform 14 and insert 17. The insert 17 is then welded to the casing to form a gas-tight seal. The getter sleeve 37 is inserted from the left hand end of the casing 11 (as seen in the drawing), the casing is evacuated and the end cap 38 inserted and welded to the casing 11.

The thermoelectric module 13 is of the form described in British patent specification No. 1,303,834 to which reference should be made for a detailed description. Briefly, the module 13 comprises a plurality of semiconductor elements alternately of P- and N- type connected together to form a series of thermocouples by electrically conductive bridges.

The heat source comprises a plutonium 238 radioisotope fuel contained in a high temperature capsule.

The device comprises a miniature source of electricity and is particularly intended for use for driving a heart pacemaker.

If the battery is subjected to radial shocks or severe accelerations, such as might be experienced should a person having the device implanted fall or bump into a wall for example, the mechanism operates to reduce stress being imposed upon the thermoelectric module 13 or its bonds to the heat source 12 and the platform 14. The manner in which the mechanism operates is as follows. When radial acceleration exceeds a predetermined level, the platform 14 rocks on the supporting surface of the insert 17 and, in so doing, drives the sleeve 28 to the left (as seen in the drawing) against the action of the spring 27. This movement causes relative movement between the cam 33 and the inclined surfaces 36 on the twelve fingers 35. The fingers 35 are thereby pressed inwardly into engagement with the periphery of the heat source 12. In this way, extra support is provided for the heat source 12 during the shock or acceleration thereby reducing stress upon the module 13. When the shock or acceleration ceases, the action of the spring 27 and the resilience of the fingers 35 will return the components to the position shown in the drawing. It will be appreciated that it is important to avoid permanent contact between the fingers and the heat source 12 because of the heat loss conduction path they would provide.

If the device should suffer a very severe radial acceleration, then continuing radial movement of the source 12, with corresponding rocking movement of the platform 14, may occur, spring fingers 35 on one side being bowed over about the fulcrum provided by the cam 33. If the acceleration is sufficiently severe, these bowed fingers will eventually make contact at their ends remote from the cam 33 with the shoulder 39 on the getter sleeve 37. In this condition, further outward radial movement of the heat source 12 is resisted by the resilience of the fingers 35 bending between two points of support, namely the cam 33 and the shoulder 39.

The mechanism thus provides cushioning of the source 12 against the effects of radial shocks or accelerations in a way in which the resilience of the cushioning increases as the magnitude of the shock or acceleration increases.

Cushioning against longitudinal shocks is provided by a spring 27.

Figure 2:
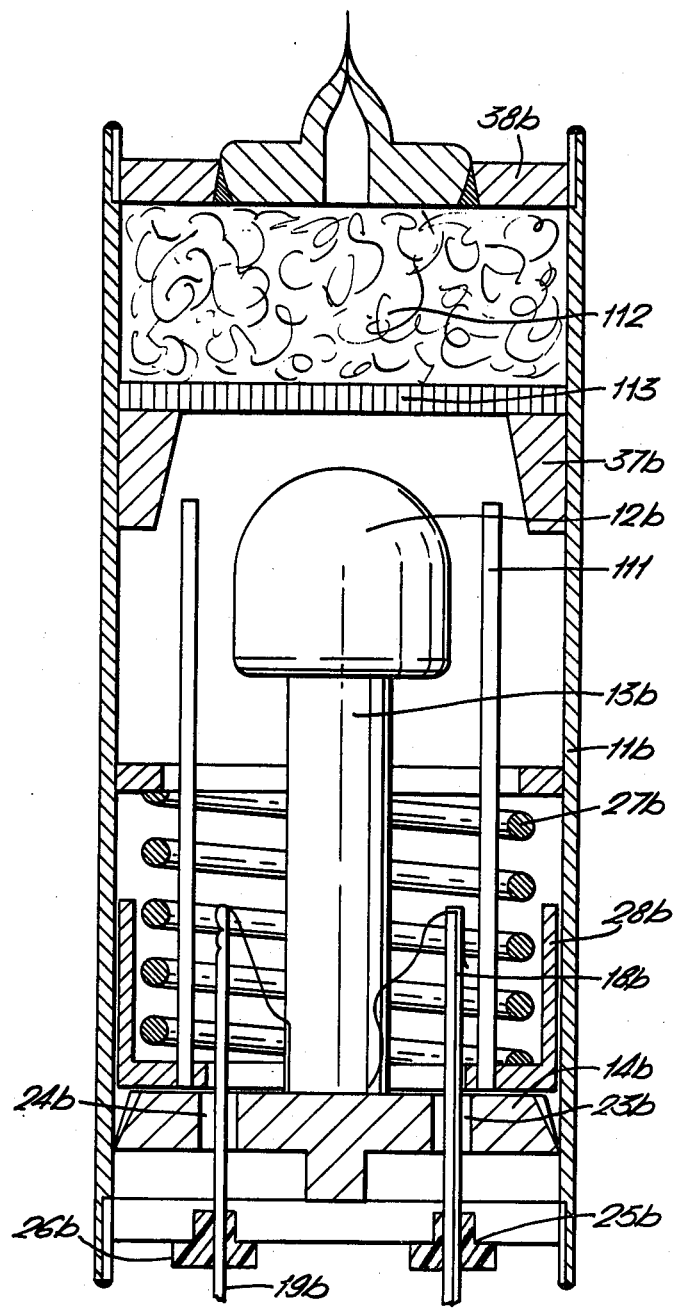
FIG. 2 is a diagrammatic axial section of a modified device.

FIG. 2 shows diagrammatically a modified device. Components in the FIG. 2 device which correspond with components in the FIG. 1 device have been referenced with the same reference numerals distinguished by the suffix "b." In the FIG. 2 device, the platform 14b functions in the same manner as the platform 14 of FIG. 1, however the platform 14b of FIG. 2 has the form of a simple bevelled disc with a central stalk, instead of the frusto-conical surface 16 in FIG. 1.

In the modified device of FIG. 2, the arrangement of collet 34, fingers 35 and cam 33 are replaced with a simple cage formed by twelve wire catch springs, of which two are shown in FIG. 2 at 111. These catch springs 111 arrest the heat source 12b if it moves into contact with them as a result of rocking of the platform 14b against the bias of spring 27b. Ability to withstand severe acceleration is not so high with the FIG. 2 device as with the FIG. 1 device but, nonetheless, the FIG. 2 device is satisfactory for many applications and in particular meets the current specification required for resistance to severe acceleration by heart pacemakers.

The other modification shown in FIG. 2 is an arrangement to provide getter 112 in a more efficient powdered form. The getter 112 is retained between a porous disc 113 and the end cap 38b. There is then no need for the sleeve 37b to be made of a getter material, but the presence of a sleeve in this position remains desirable for providing the second stage of resistance to lateral movement of the heat source 12b in the event of very severe acceleration. Thus, if the catch springs 111 are bowed over into contact with the sleeve 37b, further outward radial movement of the heat source 12b is resisted by the resilience of the catch spring 111 bending between two points of support.

Figure 3:
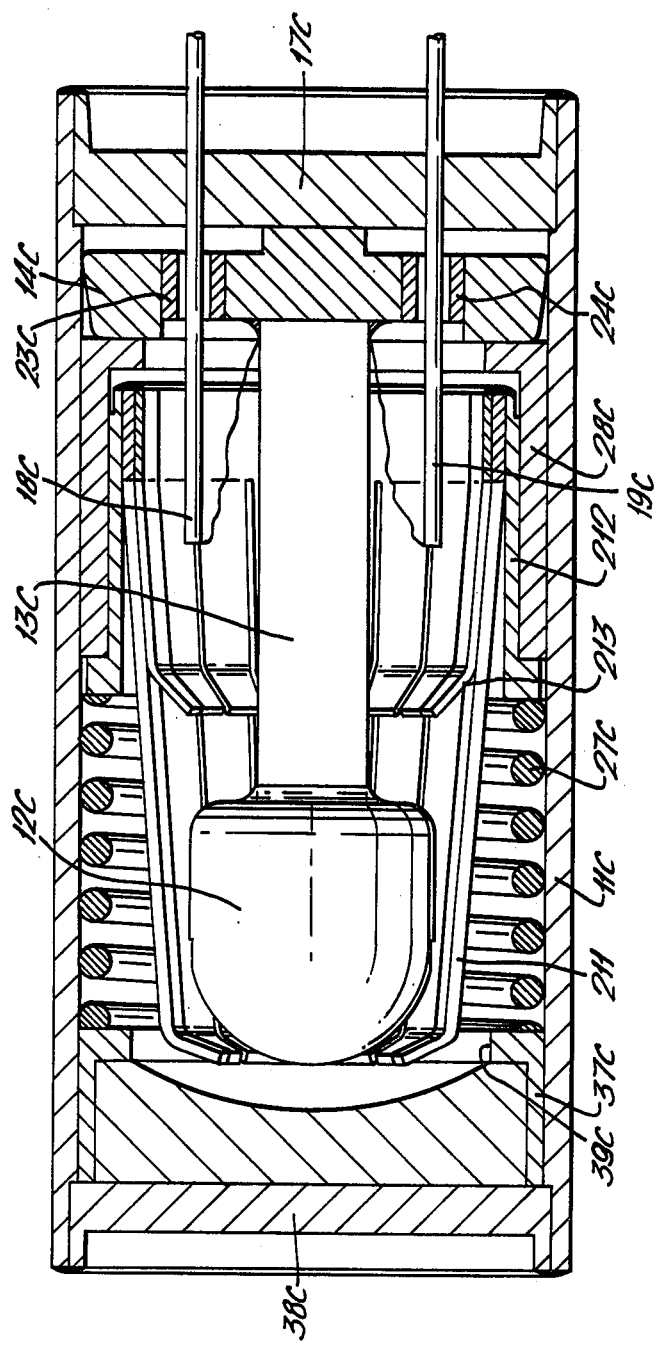
FIG. 3 is an axial section of a development of the device shown in FIG. 2.

FIG. 3 illustrates a development of the FIG. 2 device. Components in the FIG. 3 device which correspond with components in the FIG. 1 device have been referenced with the same reference numerals distinguished by the suffix "c."

In the FIG. 3 arrangement cushioning of the heat source 12c and thermoelectric module 13c against lateral shocks or accelerations is provided by a cage of spring fingers 211. The cage comprises sixteen spring fingers 211 of molybdenum strip welded to an annular collet 212 shaped so that the bulk of the collet 212 fits inside sleeve 28c. A shoulder formed by a thicker portion of collet 212 at one end engages against the corresponding end of the sleeve 28c and serves to transmit the force of spring 27c through sleeve 28c to the platform 14c. At its end remote from collet 212 the spring 27c reacts against shoulder 39c of a sleeve 37c which, although somewhat differently shaped, serves the same purposes as sleeve 37 and shoulder 39 of the device of FIG. 1.

Also welded to the collet 212 are four short fingers 213 of molybdenum strip. The ends of the spring fingers 211 and the short fingers 213 are bent inwardly sufficiently to retain the heat source 12c within the cage of spring fingers, should the heat source 12c become detached from its mounting. This is to improve the resistance of the device to the so-called "cremation test." It will be appreciated that in normal circumstances where the device is employed as a power source in a heart pacemaker, the device would be removed and returned to the manufacturer after death of the patient in whom the pacemaker is implanted. However, in case of human error, the device is required to be so constructed that the integrity of the heart source containment is maintained even if the device is exposed to the effects of cremation of the patient. Under such conditions the heat source 12c is likely to become detached and is then supported away from contact with the stainless steel of the casing 11c by the cage of spring fingers 211 and 213. Undesirable chemical reaction at the high temperature involved between the heat source containment and the stainless steel of the casing 11c is thereby avoided.

The manner in which the device of FIG. 3 provides cushioning against the effects of shocks or accelerations is substantially identical with that of the FIG. 2 device. The spring fingers 211 arrest the heat source 12c if it moves into contact with them as a result of rocking of the platform 14c against the bias of the spring 27c. If the lateral acceleration is severe the spring fingers 211 are bowed over into contact with the shoulder 39c and the further outward movement of the heat source is resisted by the resilience of the spring fingers 211 bending between two points of support.

The invention is not restricted to the details of the foregoing examples.

We claim:

1. A thermoelectric battery comprising a casing enclosing a thermoelectric assembly of elongated form, the assembly comprising a heat source, a heat sink and a thermoelectric unit attached to and extending between the heat source and the heat sink, with at least the heat source end of the assembly defining an annular space with the casing, a heat-conducting mass disposed at the heat sink end of the assembly and attached to the casing, a resilient mounting for the thermoelectric unit for reducing the stress applied thereto in the event of shock or acceleration applied to the battery, the heat source being surrounded by a cage of spring fingers which are not normally in contact with the heat source or the thermoelectric unit, each of said fingers being anchored at one end and having the other end thereof normally free, and extending into the said annular space between the heat source and the casing, and an abutment member position to be engaged by a free end of a spring finger in the event that the spring finger is bowed to a predetermined extend by the force of the heat source displaced into engagement with the spring finger under the effect of shock or acceleration, the positioning of the spring fingers and the abutment member being such that the cage of spring fingers provides two stages of arresting force for the heat source when displaced by rocking motion of the assembly in excess of a predetermined amount under shock or acceleration, the first stage comprising the arresting force provided by simple bowing of the free ends of spring finers when engaged by the heat source and the second stage, provided under severe shock or acceleration, comprising the arresting force provided by the bending of a spring finger between two points of support.

2. A thermoelectric battery comprising a cylindrical casing of stainless steel enclosing an assembly comprising a heat source secured to one end of a thermoelectric unit comprising a module in the form of a rectangular assembly of a plurality of thermoelectric elements secured together and electrically connected at their ends in the manner of a thermopile, the other end of the thermoelectric module being secured with adhesive to a stainless steel platform, the adhesive comprising epoxy resin for providing electricl insulation while maintaining good heat conducting connection between the module and the platform such that the platform acts as a heat sink for the thermoelectric module and provides a heat conducting path to the casing through an insert which the platform contacts, the surface of the platform remote from the module being shaped to permit rocking movement of the platform on the insert, the platform being biassed into engagement with the insert by the action of a spring transmitted through a cylindrical sleeve which is a sliding fit within the cylindrical casing, a cage of spring fingers disposed in the annular space between the heat source and the casing and surrounding the heat source but not normally in contact with the heat source or the thermoelectric unit, each of said spring fingers comprising molybdenum strip welded to an annular collet shaped so that the bulk of the collet fits inside the sleeve which is a sliding fit within the casing, the spring acting upon both the collet and the sleeve and reacting, at the end thereof remote from the collet, against an abutment also capable of acting as a support for the spring fingers when the latter are bowed over to a predetermined extent, a plurality of short spring fingers of molybdenum strip welded to the collet, the ends of all the spring fingers being bent inwardly to retain the heat source within the cage of spring fingers should the heat source become detached from its mounting, the cage of spring fingers being operative to provide cushioning against the effects of shocks or accelerations by serving to arrest the heat source if the heat source moves into contact with the spring fingers as a result of rocking of the platform against the basis of the spring and, if the lateral acceleration is severe, the longer spring fingers being bowed over into contact with the aforesaid abutment whereby further outward movement of the heat source is resisted by the resilience of the spring fingers bending between two points of support.

3. A thermoelectric battery as claimed in claim 1, wherein the spring fingers are shaped to form a cage which retains the heat source out of contact with the casing in the event that the heat source becomes detached from the thermoelectric unit.

4. A thermoelectric battery as claimed in claim 1, wherein acceleration responsive mechanism operates to drive the spring fingers into contact with the heat source in the event that acceleration of the heat source relative to the casing exceeds a predetermined value.

5. A device as claimed in claim 1, wherein the casing enclosing the assembly is evacuated for improving insulation against heat loss.

* * * * *